United States Patent
Ning et al.

(10) Patent No.: US 9,754,979 B2
(45) Date of Patent: Sep. 5, 2017

(54) DISPLAY DEVICE, THIN FILM TRANSISTOR, ARRAY SUBSTRATE AND MANUFACTURING METHOD THEREOF

(71) Applicant: BOE TECHNOLOGY GROUP CO., LTD., Beijing (CN)

(72) Inventors: Ce Ning, Beijing (CN); Xuehui Zhang, Beijing (CN); Jing Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 13/703,483

(22) PCT Filed: Sep. 29, 2012

(86) PCT No.: PCT/CN2012/082450
§ 371 (c)(1),
(2) Date: Dec. 17, 2013

(87) PCT Pub. No.: WO2013/071800
PCT Pub. Date: May 23, 2013

(65) Prior Publication Data
US 2014/0091331 A1 Apr. 3, 2014

(30) Foreign Application Priority Data
Nov. 17, 2011 (CN) .......................... 2011 1 0366515

(51) Int. Cl.
*H01L 29/18* (2006.01)
*H01L 27/12* (2006.01)
*H01L 27/32* (2006.01)

(52) U.S. Cl.
CPC ...... *H01L 27/1288* (2013.01); *H01L 27/1214* (2013.01); *H01L 27/1225* (2013.01);
(Continued)

(58) Field of Classification Search
CPC ............. H01L 27/3251; H01L 27/3262; H01L 27/1288; H01L 27/1214; H01L 2021/775;
(Continued)

(56) References Cited

U.S. PATENT DOCUMENTS

| 6,180,438 B1 | 1/2001 | Deane et al. |
| 2004/0183978 A1* | 9/2004 | Jeoung .......................... 349/141 |

(Continued)

FOREIGN PATENT DOCUMENTS

| CN | 101748362 A | 6/2010 |
| CN | 101826534 A | 9/2010 |

(Continued)

OTHER PUBLICATIONS

First Chinese Office Action dated Aug. 1, 2013; Appln. No. 201110366515.X.
(Continued)

*Primary Examiner* — Trung Q Dang
*Assistant Examiner* — Wasiul Haider
(74) *Attorney, Agent, or Firm* — Ladas & Parry LLP

(57) ABSTRACT

The embodiments of the invention provide a display device, a thin film transistor, an array substrate and a manufacturing method thereof. The manufacturing method comprises: step A, forming patterns of a source electrode, a drain electrode, a data line and a pixel electrode; step B, forming an active layer and a gate insulating layer in order, and forming a via hole in the gate insulating layer for connecting the data line and an external circuit; and step C, forming patterns of a gate electrode, a gate line and a common electrode line, or forming a pattern of a gate electrode, a gate line and a common electrode.

16 Claims, 4 Drawing Sheets

(52) U.S. Cl.
CPC ........ *H01L 27/1255* (2013.01); *H01L 27/326* (2013.01); *H01L 27/3248* (2013.01)

(58) Field of Classification Search
CPC ............. H01L 29/4908; H01L 51/0508; H01L 2924/13069
See application file for complete search history.

(56) References Cited

U.S. PATENT DOCUMENTS

| | | | |
|---|---|---|---|
| 2006/0292760 A1* | 12/2006 | Shih | 438/149 |
| 2007/0007515 A1* | 1/2007 | Suh | H01L 27/3246 257/40 |
| 2007/0146585 A1* | 6/2007 | Ahn | 349/106 |
| 2007/0249122 A1* | 10/2007 | Seo | H01L 27/283 438/264 |
| 2008/0002124 A1* | 1/2008 | Yang | 349/139 |
| 2008/0038867 A1* | 2/2008 | Shin | H01L 51/0005 438/99 |
| 2008/0277666 A1* | 11/2008 | Jeon | H01L 27/3244 257/66 |
| 2009/0101908 A1* | 4/2009 | Kwack | G02F 1/136286 257/59 |
| 2009/0141222 A1* | 6/2009 | Hsu et al. | 349/114 |
| 2009/0206346 A1* | 8/2009 | Long et al. | 257/72 |
| 2009/0261342 A1* | 10/2009 | Zhang | 257/72 |
| 2010/0224872 A1 | 9/2010 | Kimura | |
| 2010/0295049 A1* | 11/2010 | Yoo et al. | 257/59 |
| 2011/0031499 A1 | 2/2011 | Kimura et al. | |
| 2011/0109861 A1* | 5/2011 | Son et al. | 349/141 |
| 2011/0156995 A1* | 6/2011 | Choi et al. | 345/92 |
| 2011/0260157 A1* | 10/2011 | Yano et al. | 257/43 |
| 2011/0273639 A1* | 11/2011 | Xie et al. | 349/43 |
| 2012/0113366 A1* | 5/2012 | Xie | 349/106 |
| 2014/0248748 A1 | 9/2014 | Kawamura et al. | |

FOREIGN PATENT DOCUMENTS

| | | |
|---|---|---|
| CN | 102629585 A | 8/2012 |
| JP | 10-062816 A | 3/1998 |
| JP | 10-253983 A | 9/1998 |
| JP | 2008-175842 A | 7/2008 |
| KR | 20020040990 A | 5/2002 |
| WO | 2011134389 A1 | 3/2011 |

OTHER PUBLICATIONS

Second Chinese Office Action dated Dec. 18, 2013; Appln. No. 201110366515.X.
Korea Examination Opinion dated Feb. 27, 2014; Appln. No. 10-2012-7031151.
International Search Report dated Mar. 1, 2013; PCT/CN2012/082450.
International Preliminary Report on Patentability dated May 20, 2014; PCT/CN2012/082450.
Extended European Search Report Appln. No. 12778031.0-1504/2782153 PCT/CN201282450; Dated Aug. 26, 2015.
Japanese Office Action dated Jun. 20, 2016; Appln. No. 2014-541518.
Final Office Action issued by the Japanese Patent Office dated Mar. 6, 2017; Appln. No. 2014-541518.

* cited by examiner

DISPLAY DEVICE, THIN FILM TRANSISTOR, ARRAY SUBSTRATE AND MANUFACTURING METHOD THEREOF

CROSS REFERENCE TO RELATED APPLICATIONS

This application is a national stage application under 35 U.S.C. 371 and claims the benefit of PCT Application No. PCT/CN2012/082450 having an international filing date of Sep. 29, 2012, which designated the United States, which PCT application claimed the benefit of Chinese Application No. 201110366515.X filed Nov. 17, 2011, the disclosure of each of which are incorporated herein by reference.

TECHNICAL FIELD

Embodiments of the present invention relates to a display device, a thin film transistor, an array substrate and a manufacturing method thereof.

BACKGROUND

A thin film transistor liquid crystal display (TFT-LCD) has characteristics such as small size, low consumption, no radiation and the like, and has prevailed in the current market of the flat panel display. Amorphous silicon (a-Si) becomes the most widely used active layer material in TFT-LCDs since it is easy to be prepared in a large area under a low temperature with mature technologies. However, the amorphous silicon material has a band gap of only 1.7V, is not transparent to visible light, and has the light sensitivity within the range of visible light, thus a black matrix is needed to block light. This increases the complexity of the process for TFT-LCDs, enhances costs and decreases the reliability and the aperture ratio of displays.

In addition, with the constant increase of the sizes of liquid crystal displays, the frequencies of the drive circuits required are improved constantly. The mobility of the amorphous silicon thin film transistor is usually about 0.5 $cm^2$/VS. However, when the size of a liquid crystal display is beyond 80 inches, its driving frequency is beyond 120 Hz, and the thin film transistors require mobility over 1 $cm^2$/VS, and therefore the mobility of the existing amorphous silicon thin film transistors are hard to meet the requirement.

Oxide semiconductor thin film transistors are favored by researchers, possess many advantages and are improved fast in recent years. An oxide semiconductor has a high mobility, good uniformity and transparency, and can better meet the requirements for driving a liquid crystal display of a large size and an OLED. However, the existing oxide semiconductor thin film transistor is formed with at least four patterning processes when it is in a bottom-gate type, and protection provided with an etching stop layer (ESL), a passivation layer (PVX) and the like is needed to ensure the stability of the thin film crystal, and therefore the process is complex and the manufacture costs are high.

SUMMARY

Embodiments of the invention provide a display device, a thin film transistor, an array substrate and a manufacturing method thereof. The array substrate may be manufactured by three patterning processes so as to shorten a manufacturing time period, improve production efficiency, and decrease production costs.

One aspect of the invention provides a manufacturing method of array substrate comprising:

step A, forming patterns of a source electrode, a drain electrode, a data line and a pixel electrode;

step B, forming an active layer and agate insulating layer in order, and forming a via hole in the gate insulating layer for connecting the data line and an external circuit; and step C, forming patterns of a gate electrode, a gate line and a common electrode line, wherein the common electrode line and the pixel electrode are partially overlapped to form a storage capacitor, or form patterns of the gate electrode, the gate line and a common electrode, wherein the common electrode is adapted to generate a driving electric field along with the pixel electrode.

For example, the step A comprises: forming a first layer of transparent conducting thin film on a substrate and forming the patterns of the source electrode, the drain electrode, the data line and the pixel electrode by a patterning process.

For example, the step B comprises: forming an active layer and a gate insulating layer, and forming a via hole for connecting the data line and an external circuit by a patterning process.

For example, the step C comprises: forming a second layer of transparent conducting thin film, forming the patterns of the gate electrode, the gate line and the common electrode line by a patterning process, or, forming the patterns of the gate electrode, the gate line and a common electrode by a patterning process.

For example, forming the patterns of the source electrode, the drain electrode, the data line and the pixel electrode by the patterning process comprises: forming a layer of photoresist on the first layer of transparent conducting thin film; exposing the photoresist with a gray-tone or half-tone mask plate to form the photoresist into a non-retained region of photoresist, a partially-retained region of photoresist and a retained region of photoresist; developing; etching off the first layer of transparent conducting thin film in the non-retained region of photoresist to form the patterns of the source electrode, the drain electrode and the data line; removing the photoresist in the partially-retained region of photoresist by an ashing process and keeping the photoresist in the retained region of photoresist; etching the first layer of transparent conducting thin film in the partially-retained region of photoresist, such that this portion of the first layer of transparent conducting thin film becomes thinner to form the pattern of pixel electrode; and removing remaining photoresist.

For example, forming the via hole for connecting the data line and the external circuit by the patterning process comprises: forming a layer of photoresist on the gate insulating layer; exposing the photoresist with a mask plate to form the photoresist into a retained region of photoresist and a non-retained region of photoresist; developing; etching off the gate insulating layer and active layer in the non-retained region of photoresist to form the pattern of the via hole; and removing remaining photoresist.

For example, forming the patterns of the gate electrode, the gate line and the common electrode line by the patterning process comprises: forming a layer of photoresist on a second layer of transparent conducting thin film; exposing the photoresist with a mask plate to form the photoresist into a retained region of photoresist and a non-retained region of photoresist; developing; etching off the second layer of transparent conducting thin film in the non-retained region of photoresist to form the patterns of the gate electrode, the gate line and the common electrode line; and removing remaining photoresist.

Alternatively, for example, forming the patterns of the gate electrode, the gate line and the common electrode by a third patterning process comprises: forming a layer of photoresist on the second layer of transparent conducting thin film; exposing the photoresist with a mask plate to form the photoresist into a retained region of photoresist and a non-retained region of photoresist; developing; etching off the second layer of transparent conducting thin film in the non-retained region of photoresist to form the patterns of the gate electrode, the gate line and the common electrode; and removing remaining photoresist.

For example, the common electrode comprises slits.

For example, the active layer comprises an oxide material.

Another aspect of the invention provides a thin film transistor comprising: a transparent conducting thin film formed on a substrate, serving as a source electrode and a drain electrode, between which a channel region is defined; an oxide serving as an active layer formed on the source electrode, the drain electrode and the channel region; and a gate insulating layer and a gate electrode formed on the active layer in this order, a material of the gate electrode being a transparent conducting thin film.

Still another aspect of the invention provides an array substrate comprising: a source electrode, a drain electrode, a data line and a pixel electrode formed on the substrate, a channel region being defined between the source electrode and the drain electrode, the drain electrode and the pixel electrode are electrically connected, the data line being connected to an external circuit through a via hole, and the shape of the pixel electrode covering the whole region of the pixels; an active layer formed on the source electrode, the drain electrode, the data line and the pixel electrode; a gate insulating layer formed on the active layer;

a gate electrode, a gate line and a common electrode line formed on the gate insulating layer, wherein the common electrode line and the pixel electrode are partially overlapped to form a storage capacitor, or a gate electrode, a gate line and a common electrode formed on the gate insulating layer, wherein the common electrode is adapted to form a driving electric filed along with the pixel electrode.

For example, the active layer comprises an oxide material.

For example, the common electrode comprises slits.

Another aspect of the invention provides a display device comprising the array substrate described above.

The preparing method of the array substrate of the embodiment of the invention uses a top-gate type thin film transistor to simplify the process and use three patterning processes to realize the manufacture of an array substrate, shortening the time period for production, improving production efficiency, and decreasing production costs.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 8:
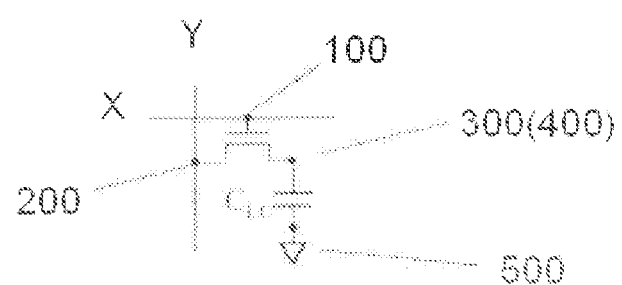
FIG. 8 is a circuit diagram of a pixel unit of an embodiment.

An array substrate of an embodiment of the invention may comprises a plurality of gate lines and a plurality of data lines, which are crossed with each other to define pixel units arranged in a matrix, each of which comprises a thin film transistor as a sw itch element and a pixel electrode for controlling orientation of liquid crystal. For example, a gate of the thin film transistor of each pixel is electrically connected to or integrally formed with a corresponding gate line, a source electrode thereof is electrically connected to or integrally formed with the corresponding data line, and a drain electrode thereof is electrically connected to or integrally formed with the corresponding pixel electrode. The following description is made with respect to one or more pixel unit(s), but other pixel units may be formed in the same way. FIG. 8 is a circuit diagram of a pixel unit of an embodiment. As shown in FIG. 8, a gate line X and a data line Y cross with each other to define a pixel unit, and a gate electrode 100 of the thin film transistor (TFT) of the pixel unit is electrically connected to the gate line X, a drain electrode 200 of the TFT is electrically connected to the data line X, and source electrode 300 of the TFT is electrically connected to the pixel electrode 400; the pixel electrode 400 forms a liquid crystal capacitor ($C_{LC}$) with a common electrode 500.

Figure 1:
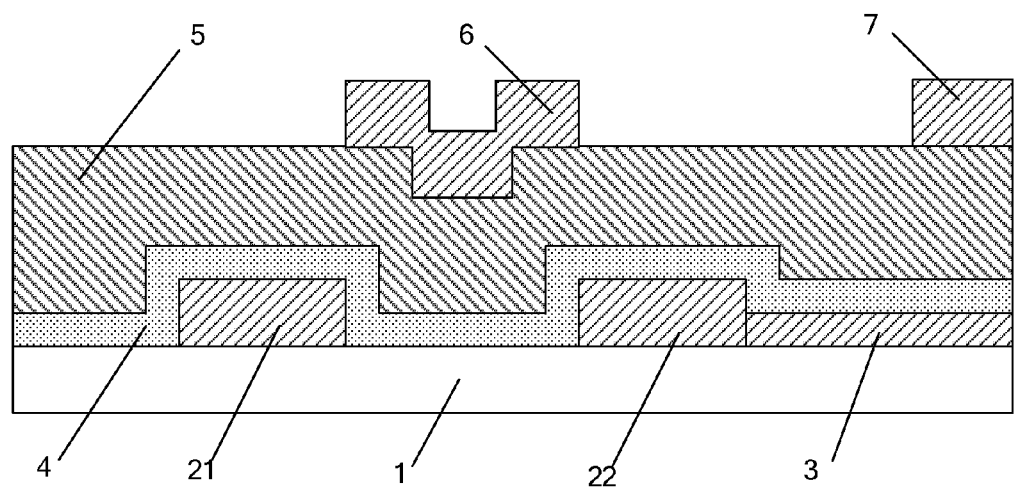
FIG. 1 is a cross-sectional view of an array substrate of an embodiment of the invention.

FIG. 1 is a cross-sectional view of an array substrate of an embodiment of the invention. With reference to FIG. 1, the array substrate comprises the following structure.

A source electrode 21, a drain electrode 22, the data line (not shown) and the pixel electrode 3 are formed on a base substrate 1. The region between the source electrode 21 and the drain electrode 22 corresponds to a channel region, the drain electrode 22 is electrically connected to the pixel electrode 3, and the data line is connected to an external circuit through a via hole. The external circuit is, for example, a circuit for driving the array substrate.

An active layer 4 is formed on the source electrode 21, the drain electrode 22, the data line and the pixel electrode 3. A gate insulating layer 5 is formed on the active layer 4. A gate electrode 6, a gate line (not shown) and a common electrode line 7 are formed on the gate insulating layer 5.

An oxide semiconductor material has a high mobility and good uniformity and is transparent, and a thin film transistor employing the oxide semiconductor material as the active layer can better meet the requirements of a liquid crystal display of a large size and an active organic electroluminescence. Thus, as a preferred solution, the material of the active layer 4 in the array substrate described above of the embodiment of the invention may be an oxide semiconductor material, such as IGZO, IZO, ZnO, In2O3 and so on. Using the oxide semiconductor material as the active layer makes this array substrate capable of being applied widely in a large size TFT-LCD, and at the same time possess advantages such as high aperture ratio, high mobility and wide viewing angle, etc. For example, the active layer 4 may have a single layer structure composed of one layer of oxide, or may has a multiple layer structure comprising at least two layers of oxide. The active layer formed of amorphous oxide IGZO, ZnO or IZO has high mobility, and the production line for manufacturing IGZO TFTs well matches the existing one for LCDs with a relatively low cost.

A method of forming patterns of respective layers on the above array substrate may be conducted by first forming a structure layer (for example a metal layer or a nonmetal layer) first, and then by using patterning processes comprising masking, etching and so on, or may be achieved by directly using usual patterning processes such as silk screen printing, printing and so on without first forming a structure layer. Those skilled in the art may make choice according to the specific requirement.

In addition, for the array substrate of such a top-gate structure (i.e. the gate is located over the active layer), the gate insulating layer can protect the active layer, and therefore a passivation layer and an etching stop layer can be omitted. In this way, the manufacture of the array substrate may be achieved by three patterning processes. Accordingly, the manufacture process of the array substrate can be simplified, and the production costs can be decreased.

The manufacturing method of the array substrate of the embodiment of the invention comprises the following steps.

Step 100: form a first layer of conducting thin film on a base substrate and form patterns of a source electrode, a drain electrode, a data line and a pixel electrode by a first patterning process.

Figure 2:
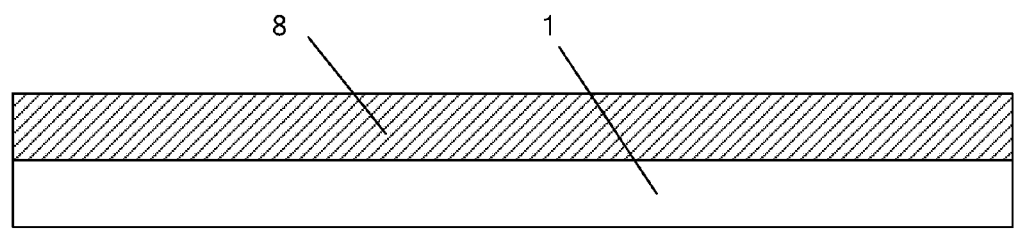
FIG. 2 is a cross-sectional view of the embodiment of the invention after forming a first layer of conducting thin film.
Figure 4:
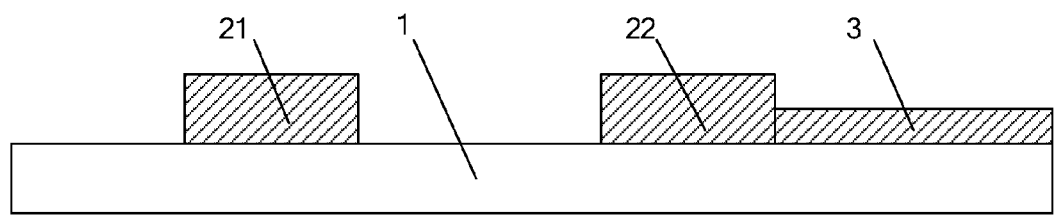
FIG. 4 is a cross-sectional view of the embodiment of the invention after completing the first patterning process.

First, one base substrate 1 is provided. The base substrate 1 may be a glass substrate or a quartz substrate, and it is cleaned if necessary; then for example, by magnetron sputtering, thermal evaporation or other film formation method, a first layer of conducting thin film 8 with a thickness of, for example, 150 nm-250 nm is formed on the substrate (as shown in FIG. 2). The first layer of conducting thin film 8 is, for example, a transparent Indium Tin Oxides (ITO) thin film, with high transmittance and good electrical conductivity. Finally, the patterns of the source electrode, the drain electrode, the data line and the pixel electrode are formed by the first patterning process (as shown in FIG. 4).

Step 200: after forming the active layer and the gate insulating layer on the base substrate of the step 100, forming a via hole for connecting the data line and the external circuit by a second patterning process.

Figure 5:
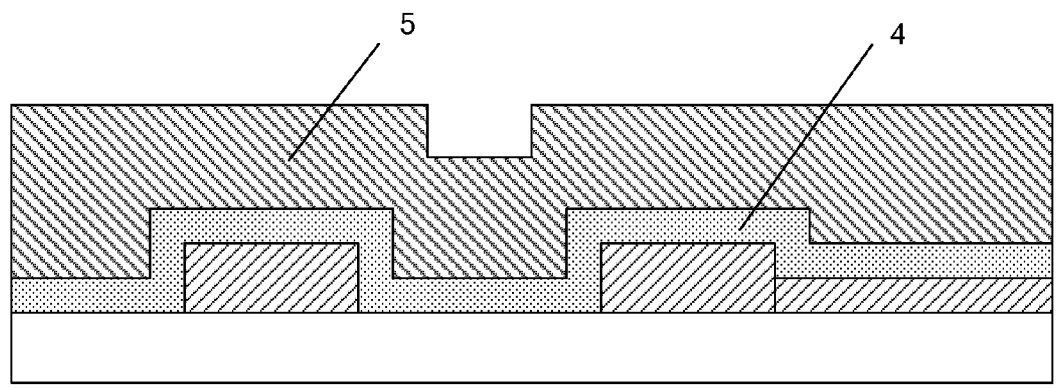
FIG. 5 is a cross-sectional view of the embodiment of the invention after completing the second patterning process.

First, an active layer with a thickness of, for example, 40-60 nm and a gate insulating layer with a thickness of, for example, 300-500 nm in this order are formed on the base substrate 1 after step 100 is completed, for example, by a plasma enhanced chemical vapor deposition (PECVD) method or a magnetron sputtering method. The material of the active layer is, for example, an oxide, which may be IGZO, ZnO, In2O3, IZO or the like. The material of the gate insulating layer may be oxide or nitride, for example, SiO2, Al2O3, AN or the like. Then, the pattern of the via hole is formed by the second patterning process (as shown in FIG. 5).

Step 300: forming a second layer of conducting thin film on the base substrate completed in step 200, and forming a pattern of the gate electrode, the gate line and the common electrode line by a third patterning process.

Figure 6:
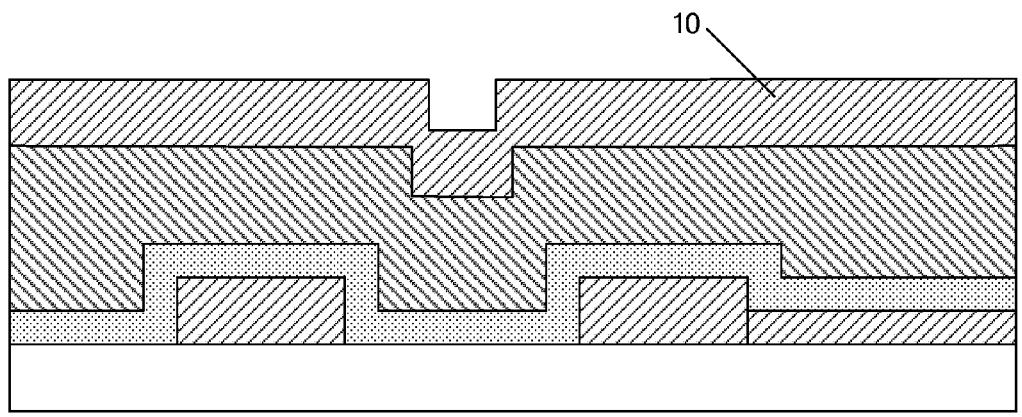
FIG. 6 is a cross-sectional view of the embodiment of the invention after forming a second layer of the conducting thin film.

For example, the second layer of conducting thin film 10 with a thickness of 150-250 nm is formed on the base substrate 1 by a magnetron sputtering method, a thermal evaporation method or other film formation method. The second layer conducting thin film 10 is preferably a transparent ITO thin film (as shown in FIG. 6) so as to have high transmittance and good electrical conductivity. Then, the patterns of the gate electrode, the gate line and the common electrode line are formed by the third patterning process (as shown in FIG. 1). The pixel electrode and the common electrode line are partially overlapped so as to form a storage capacitor therebetween.

In the step 100, on example of forming the patterns of the source electrode, the drain electrode, the data line and the pixel electrode by the first patterning process comprises the following steps.

Step S11: forming a layer of photoresist 9 on the first layer of conducting thin film 8 by, for example, coating.

Step S12: exposing the photoresist with a double-tone mask plate (for example a gray-tone mask plate or a half-tone mask plate) to obtain a latent image for forming a non-retained region of photoresist, a partially-retained region of photoresist and a retained region of photoresist. The retained region of photoresist corresponds to a region within which the source electrode, the drain electrode and the data line are located; the partially-retained region of photoresist corresponds to a region within which the pixel electrode is located; and the non-retained region of photoresist corresponds to a region other than the regions mentioned above.

Step S13: conducting a development process so that the photoresist in the non-retained region of photoresist is removed completely, the thickness of the photoresist in the partially-retained region of photoresist is reduced, and the thickness of the photoresist in the retained region of photoresist maintains unchanged.

Figure 3:
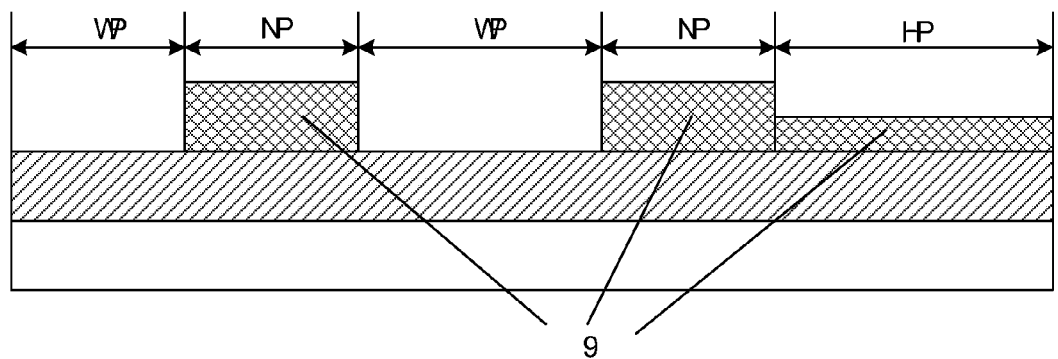
FIG. 3 is a cross-sectional view of the embodiment of the invention after an exposure and development of gray-tone or half-tone mask plate in the first patterning process.

The pattern obtained after development is shown in FIG. 3. In the figure, WP is the non-retained region of photoresist, HP is the partially-retained region of photoresist, and NP is the retained region of photoresist.

Step S14: etching off the first layer of conducting thin film exposed in the non-retained region of photoresist to form the patterns of the source/drain electrode and the data line.

Step S15: removing the photoresist in the partially-retained region of photoresist by an ashing process and retaining the photoresist in the retained region of photoresist.

Step S16: etching the first layer of conducting thin film exposed in the partially-retained region of photoresist to make said portion of the first layer conducting thin film thinner so as to form a pattern of pixel electrode.

Given that the thickness of the first layer of conducting thin film is 200 nm, this thickness may be etched off by 150 nm and 50 nm is remained, for example, in this step, thus the thickness of the obtained pixel electrode is 50 nm.

Step S17: removing remaining photoresist.

In the step 200, one example of forming the via hole for connecting the data line and the external circuit by the second patterning process comprises the following steps.

Step S21: forming a layer of photoresist on the gate insulating layer, for example, by coating.

Step S22: exposing the photoresist, for example, with a single-tone mask plate to obtain a latent image for forming the retained region of photoresist and the non-retained region of photoresist. The non-retained region of photoresist corresponds to a region in which the pattern of via hole is located, and the retained region of photoresist corresponds to a region other than the above pattern.

Step S23: conducting a development process so that the photoresist in the non-retained region of photoresist is removed totally and the thickness of the photoresist in the retained region of photoresist is kept unchanged.

Step S24: etching off the gate insulating layer and the active layer in the non-retained region of photoresist to form the pattern of via hole.

Step S25: removing remaining photoresist.

In the step 300, one example of forming the patterns of the gate electrode, the gate line and the common electrode line by a third patterning process comprises the following steps.

Step S31: forming a layer of photoresist on the second layer conducting thin film, for example, by coating.

Step S32: exposing the photoresist, for example, with a single-tone mask plate to obtain the latent image for forming the retained region of photoresist and the non-retained region of photoresist. The retained region of photoresist corresponds to a region in which the patterns of the gate electrode, the gate line and the common electrode line are located. The retained region of photoresist corresponds to a region other than the above pattern.

Step S33: conducting a development process so that the photoresist in the non-retained region of photoresist is removed completely, and the thickness of the photoresist in the retained region of photoresist is kept unchanged.

Step S34: etching off the second layer of conducting thin film in the non-retained region of photoresist to form the patterns of the gate electrode, the gate line and the common electrode line.

Step S35: removing remaining photoresist.

Figure 7:
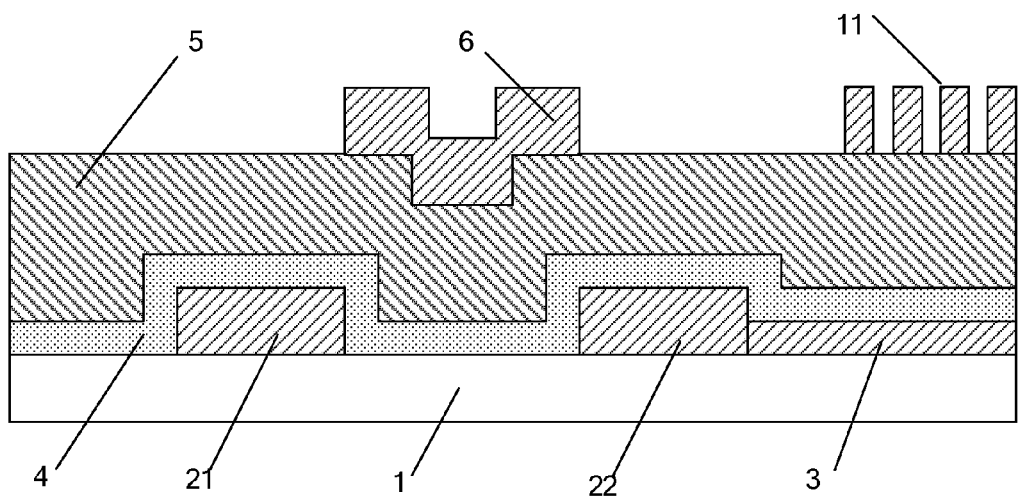
FIG. 7 is a cross-sectional view of an array substrate in another embodiment of the invention.

The structure of the thin film transistor and array substrate and the manufacturing method thereof in another embodiment of the invention are similar to those in the embodiment described above. They are different in that in the step 300, and the pattern of gate electrode, the gate line and the common electrode line is originally formed by the third patterning process, but in the present embodiment the patterns of the gate electrode, the gate line and the common electrode 11 are formed by the third patterning process. In this way, with a different mask plate, it is possible to prepare the patterns of the gate electrode, the gate line and the common electrode 11 in one patterning process, and the common electrode 11 is in a slit-like shape and comprises a plurality of slits. The array substrate has the following structures: the array substrate is provided with the pixel electrode and the common electrode 11 thereon, which are provided on different layers of the array substrate with a gate insulating layer provided therebetween, the common electrode comprises slits, and the pixel electrode is in a plate-like shape covering the whole region of pixels. As shown in FIG. 7, a multi-dimensional electric field is formed from an electric field generated at the edges of the slit-like common electrode in a same plane and an electric field generated between the common electrode layer and pixel electrode layer so that liquid crystal molecules at all orientations, which are located directly above the electrodes and between the slit electrodes in a liquid crystal cell, can be rotated and aligned, which enhances the work efficiency of planar-oriented liquid crystals and increases light transmittance. This structure can improve the picture quality of TFT-LCDs and has advantages of high transmissivity, wide viewing angles, high opening ratio, low chromatic aberration, low response time, no push Mura, etc.

Further, the embodiment of the invention also provides a display device comprising any one of the array substrates described above. The display device may comprise a liquid crystal display device, organic light emitting diode (OLED) device and the like.

When the display device is a liquid crystal display device, it may be a television, a monitor of a computer, a digital photo frame, an electronic paper, a cell phone and the like. The liquid crystal display device comprises an array substrate and an opposed substrate which are provide opposite to each other to form a liquid crystal cell, in which the liquid crystal material is filled. The opposed substrate is, for example, a color filter substrate. The pixel electrode of each pixel unit of the TFT array substrate is used to apply the electric field to control the degree of the orientation of the liquid crystal material so as to realize display operation. In some examples, the liquid crystal display also comprises a backlight for providing a back light source for the array substrate.

When the display device is an organic electroluminescence display device, the pixel electrode of each pixel unit of the array substrate serves as a positive electrode or a negative electrode for driving an organic light emitting material to emit so as to display.

In summary, the embodiments of the invention may employ three patterning processes to prepare an oxide thin film transistor and the array substrate including such an oxide thin film transistor, and can use the top-gate type structure to well simplify the process, reduce exposing processes and omit the deposition of a passivation layer, decrease costs, shorten the time period for manufacturing the TFT greatly, improve the characteristics of the thin film transistor significantly, and solve the problem of small aperture ratio.

It should be stated that the embodiments described above is used merely for explaining the technical solutions of the invention, but not to be limiting. Those skilled in the art should understand that the technical solutions could be modified or substituted equivalently without departing from the spirit of the invention, which are within the scope of the claims of the invention.

The invention claimed is:

1. A manufacturing method of array substrate comprising:
   step A, forming patterns of a source electrode, a drain electrode, a data line and a pixel electrode on a substrate by a first patterning process, wherein the source electrode, the drain electrode, the data line and the pixel electrode are formed of a same layer of transparent conductive material, the drain electrode and the pixel electrode are integrally formed, with each other, of the same transparent conductive material, and etching a portion of the transparent conductive material such that a thickness of the pixel electrode is less than a thickness of the source electrode and the drain electrode;
   step B, forming an active layer and a gate insulating layer in order on the patterns of the source electrode, the drain electrode, the data line and the pixel electrode, and patterning the gate insulating layer by a second patterning process; and
   step C, forming patterns of a gate electrode, a gate line and a common electrode line on the gate insulating layer by a third patterning process, wherein the common electrode line and the pixel electrode are partially overlapped to form a storage capacitor, or forming patterns of a gate electrode, a gate line and a common electrode on the gate insulating layer by a third patterning process, wherein the common electrode is adapted to generate a driving electric field along with the pixel electrode.

2. The manufacturing method according to claim 1, wherein:

the step A comprises: forming a first layer of transparent conducting thin film on a substrate, and forming the patterns of the source electrode, the drain electrode, the data line and the pixel electrode by the first patterning process;

the step C comprises: forming a second layer of transparent conducting thin film, and forming the patterns of the gate electrode, the gate line and the common electrode line by the third patterning process, or forming the patterns of the gate electrode, the gate line and the common electrode by the third patterning process.

3. The manufacturing method according to claim 2, wherein forming the patterns of the source electrode, the drain electrode, the data line and the pixel electrode by the patterning process comprises:

forming a layer of photoresist on the first layer of transparent conducting thin film;

exposing the photoresist with a double-tone mask plate to obtain a latent image for forming a non-retained region of photoresist, a partially-retained region of photoresist and a retained region of photoresist;

developing;

etching off the first layer of transparent conducting thin film in the non-retained region of photoresist to form the patterns of the source electrode, the drain electrode and the data line;

removing the photoresist in the partially-retained region of photoresist by an aching process and keeping the photoresist in the retained region of photoresist;

etching the first layer of transparent conducting thin film in the partially-retained region of photoresist to make this portion of the first layer of transparent conducting thin film to become thinner so as to form the pattern of the pixel electrode; and removing remaining photoresist.

4. The manufacturing method according to claim 2, wherein said patterning the gate insulation layer by a second patterning process comprises:

forming a layer of photoresist on the gate insulating layer;

exposing the photoresist using a mask plate to obtain a latent image for forming a retained region of photoresist and a non-retained region of photoresist;

developing;

etching off the gate insulating layer and active layer in the non-retained region of photoresist; and removing remaining photoresist.

5. The manufacturing method according to claim 2, wherein forming the patterns of the gate electrode, the gate line and the common electrode line by the patterning process comprises:

forming a layer of photoresist on the second layer of transparent conducting thin film;

exposing the photoresist using a mask plate to obtain a latent image for forming a retained region of photoresist and a non-retained region of photoresist;

developing;

etching off the second layer of transparent conducting thin film in the non-retained region of photoresist to form the patterns of the gate electrode, the gate line and the common electrode line; and removing remaining photoresist.

6. The manufacturing method according to claim 2, wherein forming the patterns of the gate electrode, the gate line and the common electrode by a third patterning process comprises:

forming a layer of photoresist on the second layer of transparent conducting thin film;

exposing the photoresist using a mask plate to obtain a latent image for forming a retained region of photoresist and a non-retained region of photoresist;

developing;

etching the second layer of transparent conducting thin film in the non-retained region of photoresist to form the patterns of the gate electrode, the gate line and the common electrode; and removing remaining photoresist.

7. The manufacturing method according to claim 1, wherein:

the common electrode comprises slits.

8. The manufacturing method according to claim 1, wherein:

the active layer comprises an oxide semiconductor material.

9. An array substrate comprising:

a source electrode, a drain electrode, a data line and a pixel electrode formed on a base substrate, a channel region being defined between the source electrode and the drain electrode, the drain electrode and the pixel electrode being electrically connected with each other, and the data line being connected to an external circuit, wherein the source electrode, the drain electrode, the data line and the pixel electrode are formed of a same layer of transparent conductive material, the drain electrode and the pixel electrode are integrally formed, with each other, of the same transparent conductive material, and a thickness of the pixel electrode is less than a thickness of the source electrode and the drain electrode, wherein a thicker portion of the source electrode or drain electrode is made of the transparent conductive material only;

an active layer formed on the source electrode, the drain electrode, the data line and the pixel electrode;

a gate insulating layer formed on the active layer;

a gate electrode, a gate line and a common electrode line formed on the gate insulating layer, wherein the common electrode line and the pixel electrode are partially overlapped to form a storage capacitor, or a gate electrode, a gate line and a common electrode formed on the gate insulating layer, wherein the common electrode is adapted to generate a driving electric field along with the pixel electrode.

10. The array substrate according to claim 9, wherein:
the active layer comprises an oxide material.

11. The array substrate according to claim 9, wherein:
the common electrode comprises slits.

12. The array substrate according to claim 9, wherein the source electrode, the drain electrode, the data line and the pixel electrode are formed from a same transparent conducting thin film.

13. A display device comprising the array substrate according to claim 9.

14. The display device according to claim 13, wherein the display device is a liquid crystal display device or an organic light emitting diode (OLEO) device.

15. The manufacturing method according to claim 6, wherein:
the common electrode comprises slits.

16. The array substrate according to claim 10, wherein:
the common electrode comprises slits.

* * * * *